US010819347B2

(12) United States Patent
Tanaka

(10) Patent No.: US 10,819,347 B2
(45) Date of Patent: Oct. 27, 2020

(54) RELAXATION OSCILLATOR AND ELECTRONIC DEVICE INCLUDING RELAXATION OSCILLATOR

(71) Applicant: ABLIC Inc., Chiba-shi, Chiba (JP)

(72) Inventor: Toshiyuki Tanaka, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 16/682,824

(22) Filed: Nov. 13, 2019

(65) Prior Publication Data

US 2020/0177188 A1 Jun. 4, 2020

(30) Foreign Application Priority Data

Nov. 29, 2018 (JP) .................................. 2018-223991

(51) Int. Cl.
*H03K 3/0231* (2006.01)
*H03K 3/011* (2006.01)
*H03L 1/02* (2006.01)

(52) U.S. Cl.
CPC .............. *H03L 1/027* (2013.01); *H03K 3/011* (2013.01); *H03K 3/02315* (2013.01)

(58) Field of Classification Search
CPC .. H03K 3/011; H03K 3/0231; H03K 3/02315; H03K 4/08; H03K 4/50
USPC ................................ 331/111, 143, 153, 176
See application file for complete search history.

(56) References Cited

U.S. PATENT DOCUMENTS

| 5,525,936 A * | 6/1996 | Post ........................ H03L 1/025 331/47 |
| 6,052,035 A * | 4/2000 | Nolan ..................... H03K 3/011 331/111 |
| 7,714,674 B2 * | 5/2010 | Guo .......................... H03L 1/02 331/109 |
| 8,055,932 B2 * | 11/2011 | Prihadi ..................... G06F 1/08 713/400 |
| 2009/0302954 A1 | 12/2009 | Chen et al. |
| 2017/0255220 A1 * | 9/2017 | Sivakumar .............. G05F 3/267 |

FOREIGN PATENT DOCUMENTS

JP           2010-063086 A           3/2010

* cited by examiner

*Primary Examiner* — Levi Gannon
(74) *Attorney, Agent, or Firm* — Brinks Gilson & Lione

(57) ABSTRACT

Provided is a relaxation oscillator that is very small in temperature deviation of an oscillation period. The relaxation oscillator includes an oscillation circuit, a variable frequency divider, and a counter. The oscillation circuit is configured to switch between a first clock signal having a negative value as a first-order temperature coefficient of an oscillation period, and a second clock signal having a positive value as a first-order temperature coefficient of an oscillation period, based on a signal from the counter, and to output the switched-to clock signal as a third clock signal. The variable frequency divider is configured to divide the frequency of the third clock signal that is output from the oscillation circuit, and to output the frequency-divided third clock signal as a clock signal. The counter is reset by the clock signal.

10 Claims, 10 Drawing Sheets

US 10,819,347 B2

RELAXATION OSCILLATOR AND ELECTRONIC DEVICE INCLUDING RELAXATION OSCILLATOR

RELATED APPLICATIONS

This application claims priority to Japanese Patent Application No. 2018-223991 filed on Nov. 29, 2018, the entire content of which is incorporated herein by reference.

BACKGROUND OF THE INVENTION

1. Field of the Invention

The present invention relates to a relaxation oscillator and an electronic device including a relaxation oscillator.

2. Description of the Related Art

FIG. 12 is a diagram for illustrating a basic configuration of a relaxation oscillator 100 of the related art. The relaxation oscillator 100 is configured as a combination of a relaxation oscillation circuit 101 and a variable frequency divider 102. This configuration is used commonly and widely to generate a reference clock signal having a relatively long oscillation period. A long oscillation period $P_{101}$ is generated by dividing a short oscillation period $P_{100}$ with the use of the variable frequency divider 102 at a frequency number $N_{100}$. Here, the short oscillation period $P_{100}$ is generated by the relaxation oscillation circuit 101, and the frequency number $N_{100}$ is set to an NVAL terminal and means that the frequency of the short oscillation period $P_{100}$ is to be divided into $N_{100}$. FIG. 13 is a diagram for illustrating a circuit configuration of the relaxation oscillation circuit 101. The relaxation oscillation circuit 101 includes a reference voltage source 103, a current source circuit 104, a capacitor charge/discharge circuit 105, and a charge voltage detection circuit 106.

The reference voltage source 103 supplies a reference voltage $V_{REF}$ to the current source circuit 104. The current source circuit 104 includes a variable resistor 107, an operation amplifier 108, and PMOS transistors 109 and 110. The PMOS transistors 109 and 110 have a channel width ratio of 1:$n_{101}$. The reference voltage $V_{REF}$ is supplied from the reference voltage source 103 to the current source circuit 104, and a power supply voltage VDD is supplied from the outside to the current source circuit 104.

In the current source circuit 104, a negative feedback loop is formed by the operational amplifier 108 and the PMOS transistor 109, so that a voltage applied to the variable resistor 107 is always equal to the reference voltage $V_{REF}$. Thus, when a resistance value of the variable resistor 107 is represented by $R_{101}$, a current $I_{101}$ flowing through the variable resistor 107 is expressed as reference voltage $V_{REF}$/resistance value $R_{101}$. The current source circuit 104 multiplies the current $I_{101}$ by a channel width ratio $n_{101}$ of the PMOS transistor 109 and the PMOS transistor 110, and thereby obtains a current $I_{11}$.

The capacitor charge/discharge circuit 105 includes switches 112 to 115, a variable capacitor 116, and a variable capacitor 117. The charge voltage detection circuit 106 includes a comparator 118; a comparator 119; an RS latch circuit including a NAND gate 122 and a NAND gate 123; a reference voltage source 120; and a reference voltage source 121. The reference voltage source 103 and the reference voltage sources 120 and 121 included in the charge voltage detection circuit 106 are the same voltage source (reference voltage $V_{REF}$). The three reference voltage sources are individual expressions of the same reference voltage source.

The switches 112 to 115 are controlled based on a signal CLK of oscillation output 125 and a signal CLKB of oscillation output 124. One of the switches 112 and 113 is turned off when the other is turned on. One of the switches 112 and 114 is turned off when the other is turned on. One of the switches 113 and 115 is turned off when the other is turned on. The variable capacitor 116 charges or discharges by switching the switches 112 and 114 on or off. The variable capacitor 117 charges or discharges by switching the switches 113 and 115 on or off.

The comparator 118 outputs at the Low level when a charge voltage of the variable capacitor 116 exceeds the reference voltage $V_{REF}$. The comparator 119 outputs at the Low level when a charge voltage of the variable capacitor 117 exceeds the reference voltage $V_{REF}$. The RS latch circuit includes the NAND gate 122 and the NAND gate 123. In the RS latch circuit, when one of oscillation output 124 and oscillation output 125 is at the High level, the other is at the Low level. The states of the oscillation output 124 and the oscillation output 125 are switched with each other at the instant of change to the Low level in one of the output of the comparator 118 and the output of the comparator 119.

When the resistance value of the variable resistor 107 is represented by $R_{101}$, a capacitance value of the variable capacitor 116 is represented by $C_{101}$, and a capacitance value of the variable capacitor 117 is represented by $C_{102}$, an oscillation period $P_{100}$ of the relaxation oscillation circuit 101 of the related art is represented by Expression (1).

$$P_{100} = \frac{R_{101}(C_{101} + C_{102})}{n_{101}} \quad (1)$$

In Expression (1), $n_{101}$ represents a ratio (gate width of PMOS transistor 110)/(gate width of PINTOS transistor 109) in channel width of a current-mirror circuit of the current source circuit 104.

When the relaxation oscillator 100 illustrated as the related art in FIG. 12 is formed on a semiconductor chip, the oscillation period $P_{100}$ varies greatly due to a temperature coefficient of the variable resistor 107 of the relaxation oscillation circuit 101. A resultant disadvantage is that the oscillation period $P_{101}$ varies greatly depending on temperature.

In a general semiconductor process, an absolute value of a first-order temperature coefficient of a diffusion resistor or a polysilicon resistor (POLY resistor) is large, that is, from about several hundreds of PPM/°C. to about several thousands of PPM/°C. When a resistor having a first-order temperature coefficient of 1,000 PPM/°C. is used as the variable resistor 107 and the temperature changes by 50° C., the oscillation period also varies by 5%. It is therefore impossible for the relaxation oscillator 100 of the related art that is formed on a semiconductor chip to generate an oscillation period or time that is stable in the face of temperature changes.

In a method that has been used to lessen the oscillation period variation depending on temperature (for example Japanese Patent Application Laid-open No. 2010-63086), a resistor having a positive temperature coefficient and a resistor having a negative temperature coefficient are connected in series or in parallel to be used as the variable resistor 107 of the current source circuit 104.

SUMMARY OF THE INVENTION

It is an object of the present invention to provide a relaxation oscillator more adept at generating an oscillation period or time that is highly stable in the face of temperature changes than oscillators of the past.

The present invention has been made in view of the above circumstance, and an object of the present invention is therefore to provide a relaxation oscillator, including an oscillation circuit; a variable frequency divider; and a counter, the oscillation circuit including a first clock generation circuit configured to output a first clock, the first clock having a positive value as a first-order temperature coefficient of an oscillation period; a second clock generation circuit configured to output a second clock, the second clock having a negative value as a first-order temperature coefficient of an oscillation period; a control circuit configured to generate a control signal to switch between the first clock and the second clock based upon a switching signal provided from the counter; and an output terminal from which one clock selected from the first clock and the second clock is transmitted as a third clock to the variable frequency divider and the counter based upon the control signal, the variable frequency divider including a divider setting terminal from which a division number is provided, the variable frequency divider being configured to divide a frequency of the third clock into a number determined by the division number provided from the divider setting terminal, and to output a clock obtained by dividing the frequency of the third clock as a clock of the relaxation oscillator, the counter including a counter setting terminal from which count data are provided and a reset terminal from which the clock of the relaxation oscillator is provided, the counter being configured to output one of a first and second switching signals, the first switching signal being switched in accordance with a result of counting the third clock with reference to the count data provided from the counter setting terminal, the second switching signal being switched in accordance with the clock of the relaxation oscillator provided from the reset terminal.

According to the relaxation oscillator according to at least one embodiment of the present invention, a very small deviation of the oscillation period that is induced by a temperature change can be achieved because the relaxation oscillator is configured to output a clock in one period of oscillation, the clock being obtained by switching from oscillation periods different in temperature coefficient.

DETAILED DESCRIPTION OF THE PREFERRED EMBODIMENTS

Now, a relaxation oscillator according to at least one embodiment of the present invention is described with reference to the drawings.

(First Embodiment)

Figure 1:
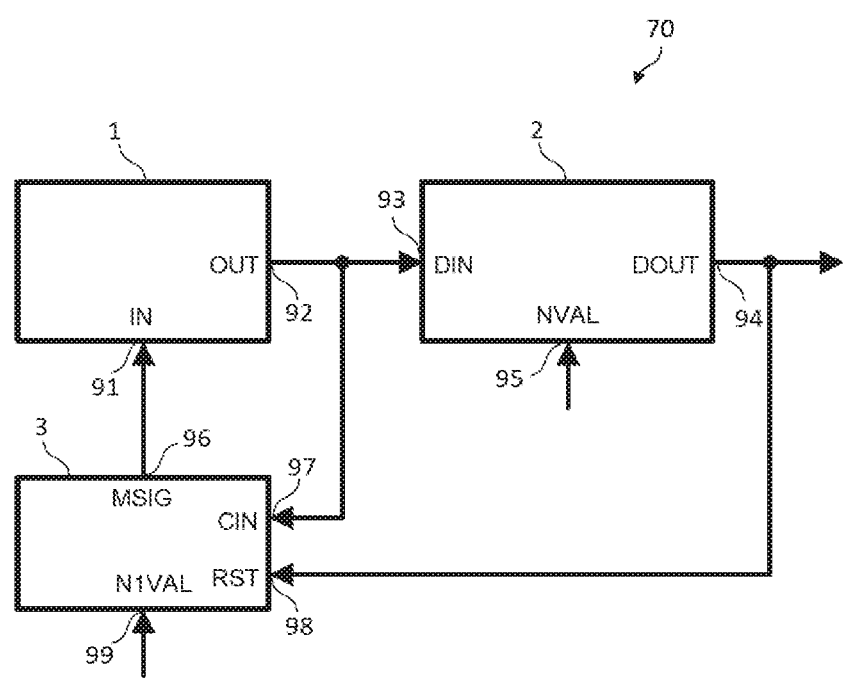
FIG. 1 is a diagram for illustrating a configuration of a relaxation oscillator according to a first embodiment of the present invention.

FIG. 1 is a diagram for illustrating a configuration of a relaxation oscillator 70 which is an example of a relaxation oscillator according to a first embodiment of the present invention. The relaxation oscillator 70 includes a relaxation oscillation circuit 1, a variable frequency divider 2, and a counter 3.

If a signal MODE input to an IN terminal 91 is at the High level, the relaxation oscillation circuit 1 outputs a clock signal having an oscillation period. $P_1$ to an OUT terminal 92. The oscillation period $P_1$ is an oscillation period having a negative value as a first-order temperature coefficient. If the signal MODE is at the Low level, the relaxation oscillation circuit 1 outputs a clock signal having an oscillation period $P_2$ to the OUT terminal 92. The oscillation period $P_2$ is an oscillation period having a positive value as a first-order temperature coefficient. Switching from the oscillation period $P_1$ to the oscillation period $P_2$, or switching from the oscillation period $P_2$ to the oscillation period $P_1$, is synchronized with the rise or fall of a clock signal of the relaxation oscillation circuit 1 itself, and the oscillation periods are switched seamlessly without stopping outputting the clock signal.

The variable frequency divider 2 divides the frequency of a clock signal that has been input from the OUT terminal 92 of the relaxation oscillation circuit 1 to a DIN terminal 93 and that has the oscillation period $P_1$ or the oscillation period $P_2$ into N, and outputs the processed clock signal to a DOUT terminal 94 as a clock signal TIME having an oscillation period P. The DOUT terminal 94 is connected to a reset terminal of the counter 3. i.e., an RST terminal 98. The division number N of the variable frequency divider 2 is set with a signal input to an NVAL terminal 95 serving as a setting input terminal of the divider 2.

The counter 3 outputs the signal MODE at the High level to an MSIG terminal 96 in synchronization with the rise of the signal input to the RST terminal 98, clears a count value on the counter, and executes counting in synchronization with the rise of a clock signal input to a CIN terminal 97. When the count value on the counter reaches count data set to an NIVAL terminal 99, the counter 3 outputs the signal MODE at the Low level. The count data set to the NIVAL terminal 99 of the counter 3 serves as a clock number of clock signals that are output in an oscillation period $P_1$ from the relaxation oscillation circuit 1.

Figure 2:
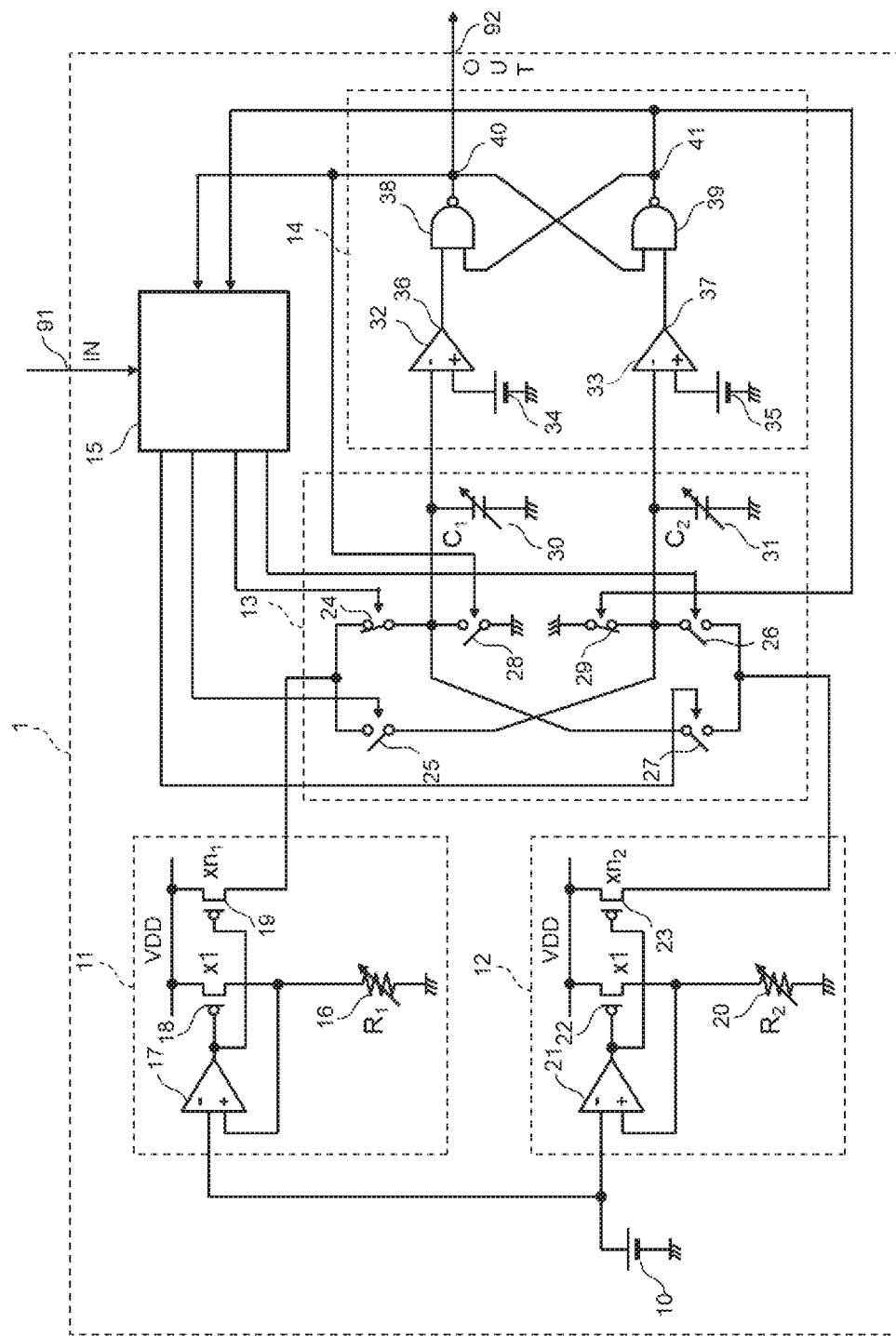
FIG. 2 is a diagram for illustrating the configuration of an oscillation circuit in the relaxation oscillator according to the first embodiment.

FIG. 2 is a diagram for illustrating a specific configuration of the relaxation oscillation circuit 1 in the relaxation oscillator 70. The relaxation oscillation circuit 1 includes a reference voltage source 10, a current source circuit 11, a current source circuit 12, a capacitor charge/discharge circuit 13, a charge voltage detection circuit 14, and a gating circuit 15. The reference voltage source 10 supplies a reference voltage $V_{REF}$ to the current source circuit 11 and the current source circuit 12.

The current source circuit 11 includes a variable resistor 16, an operation amplifier 17, and PMOS transistors 18 and 19. The reference voltage $V_{REF}$ is supplied to the current source circuit 11 from the reference voltage source 10, and a power supply voltage VDD is supplied to the current source circuit 11 from the outside. The current source circuit 11 forms a negative feedback loop through the action of the operation amplifier 17 and the PMOS transistor 18, so that a voltage applied to the variable resistor 16 is always equal to the reference voltage $V_{REF}$. This means that, when a resistance value of the variable resistor 16 is represented by $R_1$, a current $I_{01}$ flowing through the variable resistor 16 is expressed as reference voltage $V_{REF}$/resistance value $R_1$. The current $I_{01}$ flowing through the variable resistor 16 is multiplied by $n_1$ which is a channel width ratio $n_1$ of the PMOS transistor 18 and the PMOS transistor 19 to generate a current $I_1$ which is output from the current source circuit 11. The resistance value $R_1$ of the variable resistor 16 varies depending on temperature, and may be expressed with the use of a first-order temperature coefficient al and a second-order temperature coefficient $\alpha_2$ which are described later. The first-order temperature coefficient $\alpha_1$ of the resistance value $R_1$ of the variable resistor 16 takes a negative value.

The current source circuit 12 includes a variable resistor 20, an operation amplifier 21, and PMOS transistors 22 and 23. The reference voltage $V_{REF}$ is supplied to the current source circuit 12 from the reference voltage source 10, and the power supply voltage VDD is supplied to the current source circuit 12 from the outside. The current source circuit 12 has the same configuration as that of the current source circuit 11. The only difference is that the variable resistor 20 of the current source circuit 12 and the variable resistor 16 of the current source circuit 11 have first-order temperature coefficients opposite from each other in terms of the plus and minus signs. A principle of generation of a current $I_{02}$ flowing through the variable 20 of the current source circuit 12 and a principle of generation of a current $I_2$ output from the current source circuit 12 are the same as in the current source circuit 11, and descriptions thereof are accordingly omitted. A resistance value $R_2$ of the variable resistor 20 varies depending on temperature, and may be expressed with the use of a first-order temperature coefficient $\beta_1$ and a second-order temperature coefficient $\beta_2$ which are described later. The first-order temperature coefficient $\beta_1$ of the resistance value $R_2$ of the variable resistor 20 takes a positive value.

The capacitor charge/discharge circuit 13 includes switches 24 to 29, a variable capacitor 30, and a variable capacitor 31. The switch 24 is controlled with a signal CLKB1 from the gating circuit 15 described later. The switch 25 is controlled with a signal CLK1 from the gating circuit 15 described later, and has a role of supplying the current $I_1$ to one of the variable capacitor 30 and the variable capacitor 31. The switch 26 is controlled with a signal CLK2 from the gating circuit 15 described later. The switch 27 is controlled with a signal CLKB2 from the gating circuit 15 described later, and has a role of supplying the current I2 which is output from the current source circuit 12, to one of the variable capacitor 30 and the variable capacitor 31. The switch 28 is controlled with a signal CLK from an oscillation output terminal 40 of the charge voltage detection circuit 14 described later, and is used to discharge charges with which the variable capacitor 30 has been charged. The switch 29 is controlled with a signal CLKB from an oscillation output terminal 41 of the charge voltage detection circuit 14 described later, and discharges charges with which the variable capacitor 31 has been charged.

The charge voltage detection circuit 14 includes a comparator 32; a comparator 33; an RS latch circuit including a NAND gate 38 and a NAND gate 39; a reference voltage source 34; and a reference voltage source 35. Output from an output terminal 36 of the comparator 32 is at the Low level when a charge voltage of the variable capacitor 30 exceeds the reference voltage $V_{REF}$ of the reference voltage source 34. Output from an output terminal 37 of the comparator 33 is at the Low level when a charge voltage of the variable capacitor 31 exceeds the reference voltage $V_{REF}$ of the reference voltage source 35. The RS latch circuit includes the NAND gate 38 and the NAND gate 39. In the RS latch circuit, when one of the oscillation output terminal 40 and the oscillation output terminal 41 is at the High level, the other is at the Low level. The states of the oscillation output terminal 40 and the oscillation output terminal 41 are switched with each other at the instant of change to the Low level at one of the output terminal 36 of the comparator 32 and the output terminal 37 of the comparator 33. The reference voltage source 34 and reference voltage source 35 included in the charge voltage detection circuit 14 are the same power source as the reference voltage source 10. The three reference voltage sources are individual expressions of the same reference voltage source on the drawing.

The gating circuit 15 serving as the control circuit switches the oscillation mode of the relaxation oscillation circuit 1 as indicated by the signal MODE that is input to the IN terminal 91. The gating circuit 15 controls the switching on and off of the switches 24 to 27 of the charge voltage detection circuit 13 by outputting the signal CLK from the oscillation output terminal 40 of the RS latch circuit as one of the signal CLK1 used to control the switch 25, and the signal CLK2 used to control the switch 26, and by outputting the signal CLKB from the oscillation output terminal 41 of the RS latch circuit as one of the signal CLKB1 used to control the switch 24, and the signal CLKB2 used to control the switch 27.

Figures 3, 4:
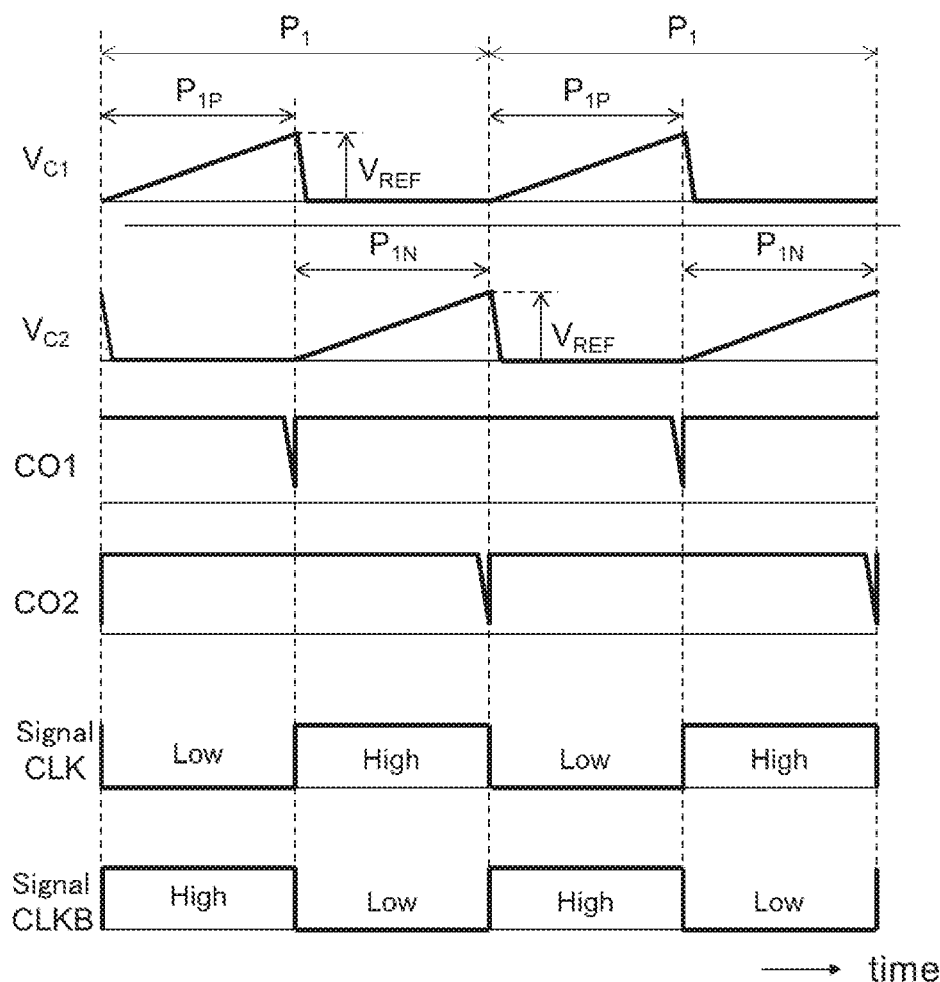
FIG. 3 is a table for illustrating states of input/output signals of a gating circuit in the relaxation oscillation circuit in the first embodiment.
FIG. 4 is charts for illustrating operation waveforms of the relaxation oscillation circuit in the first embodiment.

FIG. 3 is a table for illustrating states of input/output signals of the gating circuit 15. The operation mode is switched based on the logic level of the signal MODE at the IN terminal 91, in synchronization with the rise of the signal CLK from the oscillation output terminal 40 and the signal CLKB from the oscillation output terminal.

The relaxation oscillation circuit 1 enters an oscillation mode when the signal MODE is at the High level. In the $I_1$ oscillation mode, the signal CLK is output as the signal CLK1, the signal CLKB is output as the signal CLKB1, and the signal CLK2 and the signal CLKB2 are fixed at the Low level. In short, the current $I_1$ output from the current source circuit 11 is alternately supplied to the variable capacitor 30 and the variable capacitor 31 through control in which the switch 24 and the switch 25 are alternately switched on. The current 12 output from the current source circuit 12 is not supplied to the variable capacitor 30 and the variable capacitor 31 because the signal CLK2 and the signal CLKB2 respectively are fixed at the Low level. The capacitor charge/discharge circuit 13 operates solely on the current $I_1$ from the current source circuit 11.

The relaxation oscillation circuit 1 enters an $I_2$ oscillation mode when the signal MODE is at the Low level. In the $I_2$ oscillation mode, the signal CLK is output as the signal CLK2, the signal CLKB is output as the signal CLKB2, and the signal CLK1 and the signal CLKB1 are fixed at the Low level. In short, the current $I_2$ output from the current source circuit 12 is alternately supplied to the variable capacitor 30 and the variable capacitor 31 through control in which the switch 26 and the switch 27 are alternately switched on. The current $I_1$ output from the current source circuit 11 is not supplied to the variable capacitor 30 and the variable capacitor 31 because the signal CLK1 and the signal CLKB1 respectively are fixed at the Low level. The capacitor charge/discharge circuit 13 operates solely on the current $I_2$ from the current source circuit 12.

The operation of the relaxation oscillation circuit 1 of FIG. 2 is described below with reference to operation waveforms illustrated in FIG. 4. The operation waveforms of FIG. 4 are operation waveforms of the components that are observed when a signal input through the IN terminal 91 to the gating circuit 15 is at the High level and the $I_1$ oscillation mode is in effect. Horizontal axes in FIG. 4 indicate time. Vertical axes in FIG. 4 indicate the voltage for a charge potential $V_{C1}$ of the variable capacitor 30 and for a charge potential $V_{C2}$ of the variable capacitor 31, and indicate the logic level for a signal CO1 of the output terminal 36 of the comparator 32, for a signal CO2 of the output terminal 37 of the comparator 33, for the signal CLK, and for the signal CLKB. The oscillation operation of the relaxation oscillation circuit 1 is executed in the order described below.

In a case where the signal CLK at the oscillation output terminal 40 is at the Low level and the signal CLKB at the oscillation output terminal 41 is at the High level, the signal CLK1 is at the Low level, the signal CLKB1 is at the High level, the signal CLK2 and the signal CLKB2 are fixed at the Low level, the signal CLK is at the Low level, and the signal CLKB is at the High level. In this case, the switch 25 is switched off, the switch 24 is switched on, the switches 26 and 27 are switched off, the switch 28 is switched off, and the switch 29 is switched on. The variable capacitor 30 is charged with the current $I_1$ output from the current source circuit 11. The charges in the variable capacitor 31 are discharged by the flipping of the switch 29 to zero.

When the charging of the variable capacitor 30 progresses and the charge potential $V_{C1}$ of the variable capacitor 30 reaches the reference voltage $V_{REF}$, the potential of the signal CO1 at the output terminal 36 of the comparator 32 drops to the Low level for an instant, with the result that the logic levels of the signal CLK at the oscillation output terminal 40 and the signal CLKB at the oscillation output terminal 41 are inverted in the RS latch circuit including the NAND gates 38 and 39, thereby changing the ON/OFF state of the switch 24 to OFF, the ON/OFF state of the switch 25 to ON, the ON/OFF state of the switch 28 to ON, and the ON/OFF state of the switch 29 to OFF. The logic level inversion of the signal CLK at the oscillation output terminal 40 to the High level and the logic level inversion of the signal CLKB at the oscillation output terminal 41 to the Low level cause the charges with which the variable capacitor 30 has been charged to discharge by the flipping of the switch 28, and the charge potential $V_{C1}$ decreases to zero, and cause the current $I_1$ output from the current source circuit 11 to charge the variable capacitor 31.

When the charging of the variable capacitor 31 progresses and the charge potential $V_{C2}$ of the variable capacitor 31 reaches the reference voltage $V_{REF}$, the potential of the signal CO2 at the output terminal 37 of the comparator 33 drops to the Low level for an instant, with the result that the logic levels of the signal CLK at the oscillation output terminal 40 and the signal CLKB at the oscillation output terminal 41 are inverted in the RS latch circuit including the NAND gates 38 and 39, thereby changing the ON/OFF state of the switch 24 to ON, the ON/OFF state of the switch 25 to OFF, the ON/OFF state of the switch 28 to OFF, and the ON/OFF state of the switch 29 to OFF. The logic level inversion of the signal CLK at the oscillation output terminal 40 to the Low level and the logic level inversion of the signal CLKB at the oscillation output terminal 41 to the High level cause the charges with which the variable capacitor 31 has been charged to discharge by the flipping of the switch 29, and the charge potential $V_{C2}$ decreases to zero, and cause the current $I_1$ output from the current source circuit 11 to charge the variable capacitor 30.

The relaxation oscillation circuit 1 repeats the series of operations described above, to thereby alternate between a period ($P_{1P}$) in which the variable capacitor 30 is charged with the current $I_1$ and a period ($P_{1N}$) in which the variable capacitor 31 is charged with the current $I_1$, and maintain the oscillation state throughout the oscillation period $P_1$ which is expressed by $P_1 = P_{1P} + P_{1N}$.

When a signal input through the IN terminal 91 to the gating circuit 15 is at the Low level, the oscillation operation of the relaxation oscillation circuit 1 in the $I_2$ oscillation mode is similar to the operation described above that is executed when a signal input through the IN terminal 91 is at the High level, except that the current $I_1$, the signal CLK1, and the signal CLKB1 in the description described above are replaced by the current $I_2$, the signal CLK2, and the signal CLKB2, respectively. A detailed description on the oscillation operation in the $I_2$ oscillation mode is therefore omitted. The relaxation oscillation circuit 1 alternates between a period ($P_2P$) in which the variable capacitor 30 is charged with the current $I_2$ and a period ($P_{2N}$) in which the variable capacitor 31 is charged with the current $I_2$, and maintains the oscillation state throughout the oscillation period $P_2$ which is expressed by $P_2 = P_{2P} + P_{2N}$.

A description complemented by mathematical expressions is described below on a compensation principle to compensate for a deviation of the oscillation period that is induced by a temperature change in the relaxation oscillator according to the first embodiment of the present invention. The premise here is that the capacitors are so much smaller in temperature coefficient than resistors that the temperature coefficients of the capacitors are negligible.

Expression (2) is an expression that expresses the resistance value $R_1$ of the variable resistor 16 taking the first-order and second-order temperature coefficients into consideration. Expression (3) is an expression that expresses the resistance value $R_2$ of the variable resistor 20 taking the first-order and second-order temperature coefficients into consideration.

$$R_1 = R_{01}(1 + \alpha_1 \Delta T + \alpha_2 \Delta T^2) \quad (2)$$

$$R_2 = R_{02}(1 + \beta_1 \Delta T + \beta_2 \Delta T^2) \quad (3)$$

In Expression (2) and Expression (3):

$\Delta T$ represents a temperature variation amount from a reference temperature $T_0$, $R_{01}$ represents a resistance value of the variable resistor 16 at the reference temperature, $R_{02}$ represents a resistance value of the variable resistor 20 at the reference temperature, $\alpha_1$ represents a first-order temperature coefficient of the variable resistor 16, $\alpha_2$ represents a second-order temperature coefficient of the variable resistor 16, $\beta_1$ represents a first-order temperature coefficient of the variable resistor 20, and $\beta_2$ represents a second-order temperature coefficient of the variable resistor 20.

The relaxation oscillation circuit 1 has the oscillation period $P_1$ as the oscillation period in the $I_1$ oscillation mode (in which the signal MODE is at the High level), and has the oscillation period $P_2$ as the oscillation period in the $I_2$ oscillation mode (in which the signal MODE is at the Low level). The oscillation period $P_1$ and the oscillation period $P_2$ are expressed by Expression (4) and Expression (5), respectively.

$$P_1 = P_{01}(1+\alpha_1 \Delta T + \alpha_2 \Delta T^2) \quad (4)$$

$$P_2 = P_{02}(1+\beta_1 \Delta T + \beta_2 \Delta T^2) \quad (5)$$

In Expression (4) and Expression (5), $P_{01}$ represents the value of the oscillation period $P_1$ at the reference temperature $T_0$ and $P_{02}$ represents the value of the oscillation period $P_2$ at the reference temperature $T_0$. The values $P_{01}$ and $P_{02}$ are expressed by Expression (6) and Expression (7), respectively.

Expression (6) and Expression (7) indicate that the oscillation period $P_1$ and the oscillation period $P_2$ are changeable at the same ratio by varying the sum of the capacitances of the variable capacitor 30 and the variable capacitor 31, that the oscillation period $P_1$ is changeable by varying the resistance value $R_1$ of the variable resistor 16, and that the oscillation period $P_2$ is changeable by varying the resistance value $R_2$ of the variable resistor 20.

$$P_{01} = \frac{(C_1+C_2)R_{01}}{n_1} \quad (6)$$

$$P_{02} = \frac{(C_1+C_2)R_{02}}{n_2} \quad (7)$$

In Expression (6) and Expression (7):

$C_1$ represents a capacitance value of the variable capacitor 30, $C_2$ represents a capacitance value of the variable capacitor 31, $n_1$ represents a ratio in channel width of the current-mirror circuit of the current source circuit 11 ((gate width of PMOS transistor 19)/(gate width of PMOS transistor 18)), and $n_2$ represents a ratio in channel width of the current-mirror circuit of the current source circuit 12 ((gate width of PMOS transistor 23)/(gate width of PMOS transistor 22)).

As indicated by Expression (2) and Expression (4), the temperature coefficient of the oscillation period $P_1$ of the relaxation oscillation circuit 1 is the same as the temperature coefficient of the resistance value $R_1$ of the variable resistor 16. As indicated by Expression (3) and Expression (5), the temperature coefficient of the oscillation period $P_2$ of the relaxation oscillation circuit 1 is the same as the temperature coefficient of the resistance value $R_2$ of the variable resistor 20.

The relaxation oscillation circuit 1 illustrated in FIG. 2 is an example of an oscillation circuit usable as the relaxation oscillation circuit 1 in the first embodiment of the present invention. The relaxation oscillation circuit 1 in the first embodiment of the present invention may be any oscillation circuit as long as the oscillation circuit is configured to base oscillation in the oscillation period $P_1$ having a negative first-order temperature coefficient on the resistance value of a resistor having a negative first-order temperature coefficient; base oscillation in the oscillation period $P_2$ having a positive first-order temperature coefficient on the resistance value of a resistor having a positive first-order temperature coefficient; and switch between the oscillation period $P_1$ and the oscillation period $P_2$ seamlessly without stopping, in response to a signal from the outside and in synchronization with an oscillation clock signal CLK of the oscillation circuit.

A compensation principle to compensate for a deviation of the oscillation period that is induced by a temperature change in the relaxation oscillation circuit 1 in the first embodiment is described with reference to a timing chart illustrated in FIG. 5. Horizontal axes in FIG. 5 indicate time. Vertical axes in FIG. 5 indicate the logic level. In the first embodiment, a deviation of the oscillation period that is induced by a temperature change is compensated by adjusting a clock number $N_1$ in the oscillation period $P_1$ of the relaxation oscillation circuit 1 and a clock number $N_2$ in the oscillation period $P_2$ thereof. The clock number $N_1$ in the oscillation period $P_1$ is adjusted by adjusting the count value on the counter 3.

A principle of compensation for a first-order temperature deviation of the oscillation period of the relaxation oscillation circuit 1 is described first. The relaxation oscillation circuit 1 outputs the signal CLK having the oscillation period $P_1$ from the OUT terminal 92 when a signal input to the IN terminal 91 is at the High level. The counter 3 executes counting in synchronization with the rise of the signal CLK output from the relaxation oscillation circuit 1.

The clock number $N_1$ in the oscillation period $P_1$ is set as count data to the counter 3 from the outside through the N1VAL terminal 99 serving as a setting terminal of the counter 3. When the count value on the counter 3 reaches the count data, the signal MODE output from the MSIG terminal 96 is changed to the Low level. The signal MODE at the Low level is input to the IN terminal 91, and the relaxation oscillation circuit 1 switches from the oscillation period $P_1$ to the oscillation period $P_2$ when the next oscillation period begins.

The variable frequency divider 2 divides the frequency of a clock signal of the relaxation oscillation circuit 1 into N and, at the time the sum of counted clock numbers of clock signals in the oscillation period $P_1$ and the oscillation period $P_2$ reaches N, outputs the clock signal TIME at the High level to the DOUT terminal 94. An output signal from the variable frequency divider 2 is input to the RST terminal 98 of the counter 3 to reset the count value on the counter 3 to zero. At the same time, the counter 3 updates the level of the signal MODE at the MSIG terminal 96 to the High level, and starts the next counting operation cycle.

Figure 5:
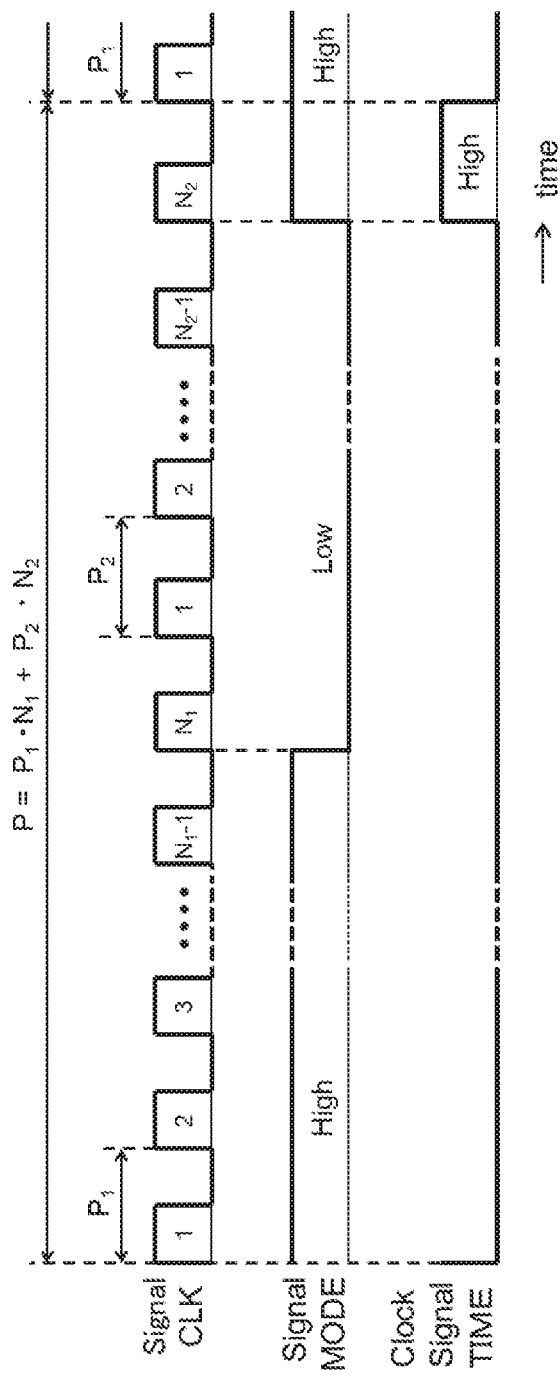
FIG. 5 is charts for illustrating operation waveforms of the relaxation oscillator according to the first embodiment.

As is clear from FIG. 5, the sum of the clock number $N_1$ in the oscillation period $P_1$ of the relaxation oscillation circuit 1 and the clock number $N_2$ in the oscillation period $P_2$ thereof is equal to the division number N of the variable frequency divider 2, and a relationship between the division number and the clock numbers is expressed by Expression (8).

$$N = N_1 + N_2 \quad (8)$$

The oscillation period P of output from the relaxation oscillator according to the first embodiment of the present invention is expressed by Expression (9) because the oscillation period $P_1$ and oscillation period $P_2$ of the relaxation oscillation circuit 1 are expressed by Expression (4) and Expression (5) described above.

$$P = N_1 P_1 + N_2 P_2 \\
= N_1 P_{01} + N_2 P_{02} + (\alpha_1 N_1 P_{01} + \beta_1 N_2 P_{02})\Delta T + \\
(\alpha_2 N_1 P_{01} + \beta_2 N_2 P_{02})\Delta T^2 \quad (9)$$

A condition for canceling the first-order temperature deviation of the oscillation period P is the value of the third term (term with $\Delta T$) of Expression (9) being zero. The condition is expressed by Expression (10).

$$\frac{N_1}{N_2} = -\frac{\beta_1}{\alpha_1}\frac{P_{02}}{P_{01}} \quad (10)$$

A condition under which Expression (10) is established is the right side of Expression (10) being a positive value. In other words, a condition for canceling the first-order temperature deviation of the oscillation period P corresponds to a case in which one of a first-order temperature coefficient $\alpha_1$ of the oscillation period $P_1$ (i.e., the first-order temperature coefficient $\alpha_1$ of the resistance value of the variable resistor 16) and a first-order temperature coefficient $\beta_1$ of the oscillation period $P_2$ (i.e., the first-order temperature coefficient $\beta_1$ of the resistance value of the variable resistor 20) is a negative value whereas the other is a positive value and, on top of that, "the ratio between the clock number $N_1$ in the oscillation period $P_1$ of the relaxation oscillation circuit 1 and the clock number $N_2$ in the oscillation period $P_2$ thereof (clock number $N_2$ in the oscillation period $P_2$ is a value obtained by subtracting the clock number $N_1$ in the oscillation period $P_1$ from the division number N)" is equal to "the ratio between a product that is obtained by multiplying the first-order temperature coefficient $\beta_1$ of the oscillation period $P_2$ of the relaxation oscillation circuit 1 by the oscillation period value $P_{02}$ and a product that is obtained by multiplying the first-order temperature coefficient $\alpha_1$ of the oscillation period $P_1$ of the relaxation oscillation circuit 1 by the oscillation period value $P_{01}$" at the reference temperature $T_0$.

A principle of compensation for a second-order temperature deviation of the oscillation period of the relaxation oscillation circuit 1 is described next. The clock number $N_1$ in the oscillation period $P_1$ and the clock number $N_2$ in the oscillation period $P_2$ that cause the first-order temperature deviation of the oscillation period to be zero at the reference temperature $T_0$ ($\Delta T=0$) are defined as a clock number $N_{01}$ and a clock number $N_{02}$, respectively. The sum of the clock number $N_{01}$ and the clock number $N_{02}$ has a relationship expressed by Expression (11) as in Expression (8). The clock number $N_{01}$ and the clock number $N_{02}$ are expressed by Expression (12) and Expression (13), respectively.

$$N = N_{01} + N_{02} \quad (11)$$

$$N_{01} = N\frac{P_{02}\beta_1}{P_{02}\beta_1 - P_{01}\alpha_1} \quad (12)$$

$$N_{02} = N\frac{P_{01}\alpha_1}{P_{01}\alpha_1 - P_{02}\beta_1} \quad (13)$$

A condition for cancelling the first-order and second-order temperature deviations of the oscillation period at the same time is the values of the third term (the term with $\Delta T$) and the fourth term (the term with $\Delta T^2$) in Expression (9) being both zero. Incidentally, the third and fourth terms in Expression (9) vary depending on temperature. Approximate solutions for conditions of the clock number $N_1$ in the oscillation period $P_1$ and the clock number $N_2$ in the oscillation period $P_2$ under which the third term and the fourth term in Expression (9) are zero are expressed by Expression (14) and Expression (15).

$$N_1 \approx N_{01}\left[1 + \left(\frac{\beta_2}{\beta_1} - \frac{P_{02}\beta_2 - P_{01}\alpha_2}{P_{02}\beta_1 - P_{01}\alpha_1}\right)\Delta T\right] \quad (14)$$
$$\equiv N_{01} + N_{01}\gamma_1\Delta T$$
$$\equiv N_{01} + \Delta N_1$$

$$N_2 \approx N_{02}\left[1 + \left(\frac{\alpha_2}{\alpha_1} - \frac{P_{01}\alpha_2 - P_{02}\beta_2}{P_{01}\alpha_1 - P_{02}\beta_1}\right)\Delta T\right] \quad (15)$$
$$\equiv N_{02} + N_{02}\gamma_2\Delta T$$
$$\equiv N_{02} + \Delta N_2$$

In Expression (14) and Expression (15), $\Gamma_1$, $\Gamma_2$, $\Delta N_1$, and $\Delta N_2$ are defined as follows:

$\Gamma_1$: a temperature coefficient of the clock number $N_1$ in the oscillation period $P_1$ for compensating for the second-order temperature deviation of the oscillation period P.

$$\gamma_1 = \frac{\beta_2}{\beta_1} - \frac{P_{02}\beta_2 - P_{01}\alpha_2}{P_{02}\beta_1 - P_{01}\alpha_1} \quad (16)$$

$\Gamma_2$: a temperature coefficient of the clock number $N_2$ in the oscillation period $P_2$ for compensating for the second-order temperature deviation of the oscillation period P.

$$\gamma_2 = \frac{\alpha_2}{\alpha_1} - \frac{P_{01}\alpha_2 - P_{02}\beta_2}{P_{01}\alpha_1 - P_{02}\beta_1} \quad (17)$$

$\Delta N_1$: a variable amount of the clock number $N_1$ in the oscillation period $P_1$ for compensating (for reducing to zero by cancellation) for the second-order temperature variation of the oscillation period $P_1$.

$\Delta N_2$: a variable amount of the clock number $N_2$ in the oscillation period $P_2$ for compensating (for reducing to zero by cancellation) for the second-order temperature variation of the oscillation period $P_2$.

Expression (14) and. Expression (15) indicate that the second-order temperature deviation of the oscillation period P can be reduced to zero through compensation by setting the value of $N_1$ to the clock number $N_{01}$ at which the first-order temperature deviation of the oscillation period P is zero, varying $N_1$ by $\Delta N_1$ ($=N_{01}\Gamma_1\Delta T$) in proportion to the temperature variation amount, setting the value of $N_2$ to the clock number $N_{02}$ at which the first-order temperature deviation of the oscillation period P is zero, and varying $N_2$ by $\Delta N_2$ ($=N_{02}\Gamma_2\Delta T$) in proportion to the temperature variation amount.

Expression (14) and Expression (15) described above express the conditions for compensating for the second-order temperature deviation of the oscillation period P. However, when Expression (14) and Expression (15) are substituted in Expression (9), a state in which the oscillation period P is constant regardless of temperature is not accomplished because the temperature change amount $\Delta T$ is included in the second term in each of Expression (14) and Expression (15). Expression (9) in which Expression (14) and Expression (15) substituted shows that the magnitudes of the first term and the second term in Expression (9) vary depending on temperature. In short, a condition, for giving zero as the value of the third term (the term with $\Delta T$) in Expression (18) obtained by substituting Expression (14) and Expression (15) for the first term and the second term in Expression (9), is required as well in order to keep the oscillation period P constant regardless of temperature.

$$\begin{aligned} P &= N_1 P_{01} + N_2 P_{02} \\ &= (N_{01} + N_{01}\gamma_1 \Delta T) P_{01} + (N_{02} + N_{02}\gamma_2 \Delta T) P_{02} \\ &= N_{01} P_{01} + N_{02} P_{02} + (N_{01}\gamma_1 P_{01} + N_{02}\gamma_2 P_{02})\Delta T \end{aligned} \quad (18)$$

A condition expressed by Expression (19) is derived as the condition for giving zero as the value of the third term in Expression (18). In other words, that the oscillation period $P_1$ and oscillation period $P_2$ of the relaxation oscillation circuit 1 are equal to each other at the reference temperature $T_0$ is an indispensable condition. It is also analytically derived that a relationship expressed by Expression (20) is established when the condition of Expression (19) is guaranteed.

$$P_{01} = P_{02} \quad (19)$$

$$\begin{aligned} \Delta N &\equiv \Delta N_1 = -\Delta N_2 \\ &= N_{01}\gamma_1 \Delta T = -N_{02}\gamma_2 \Delta T \end{aligned} \quad (20)$$

$\Delta N$: the absolute value of a variable amount of the "clock number $N_1$ in the oscillation period $P_1$" or the "clock number $N_2$ in the oscillation period $P_2$" for compensation in which the second-order temperature deviation of the oscillation period P is reduced to zero by cancellation.

The relationship expressed by Expression (20) indicates that the variable amount $\Delta N_1$ of the clock number $N_1$ in the oscillation period $P_1$ for compensating for the second-order temperature deviation of the oscillation period P and the variable amount $\Delta N_2$ of the clock number $N_2$ in the oscillation period $P_2$ for compensating for the second-order temperature deviation of the oscillation period P are equal to each other in magnification and are opposite from each other in terms of the plus and minus signs. The conditions for cancelling the first-order and second-order temperature deviations described above are summarized with reference to the configuration of FIG. 1 and the circuit of FIG. 2.

First, the oscillation period P is adjusted at the reference temperature $T_0$. The oscillation period value $P_{01}$ and the oscillation period value $P_{02}$ are adjusted to the same value as indicated by Expression (19) at the reference temperature $T_0$. Specifically, the values of the variable resistor 16, variable resistor 20, variable capacitor 30, and variable capacitor 31 of the relaxation oscillation circuit 1 are adjusted. The oscillation period P of the relaxation oscillator 70 may be set to a desired oscillation period by adjusting the division number N of the variable frequency divider 2. The oscillation period P of the oscillator is independent of the ratio between the clock number $N_{01}$ at the oscillation period value $P_{01}$ and the clock number $N_{02}$ at the oscillation period value $P_{02}$.

The clock number $N_1$ at the oscillation period value $P_{01}$ and the clock number $N_{02}$ at the oscillation period value $P_{02}$ are adjusted next. The ratio between the clock number $N_{01}$ at the oscillation period value $P_{01}$ and the clock number $N_{02}$ at the oscillation period value $P_{02}$ at the reference temperature $T_0$ for canceling the first-order temperature deviation is calculated based on Expression (12) and Expression (13), and on the temperature coefficients of the resistance values of the variable resistor 16 and the variable resistor 20. This calculation uses the values of the temperature coefficients $\alpha_1$, $\beta_1$, $\alpha_2$, and $\beta_2$ of the variable resistors 16 and 20. The values of the temperature coefficients $\alpha_1$, $\beta_1$, $\alpha_2$, and $\beta_2$ are obtained by changing the ambient temperature from the reference temperature $T_0$ and directly measuring the resistance values of the variable resistors 16 and 20, or are indirectly obtained by measuring the oscillation periods $P_1$ and $P_2$ of the relaxation oscillation circuit 1. The measurement may be taken by, for example, operating the relaxation oscillation circuit 1 in the $I_1$ oscillation mode, or the $I_2$ oscillation mode, alone.

Lastly, the second-order deviation of the oscillation period is compensated by calculating the value of $\Delta N$ when the temperature changes from the reference temperature $T_0$ by the temperature change amount $\Delta T$ with the use of Expression (18) and the temperature coefficient $\Gamma_1$ expressed by Expression (16), or the temperature coefficient $\Gamma_2$ expressed by Expression (17), and adding $\Delta N$ ($\Delta N$ may take a negative value) to a set value that is set as the clock number $N_1$ at the oscillation period value $P_{01}$ to the N1VAL terminal 99 of the counter 3. In this case, the sum of the clock number $N_1$ at the oscillation period value $P_{01}$ and the clock number $N_2$ at the oscillation period value $P_{02}$ is equal to the division number N of the variable frequency divider 2. The value of $N_2$ is uniquely determined once $N_1$ is set because the division number N is constant, and there is no need to separately control $N_2$.

The relaxation oscillator according to the first embodiment of the present invention is not originally designed to generate an output waveform that has a constant duty ratio of 50%. In order for the relaxation oscillator according to the first embodiment to generate an output waveform that has a constant duty ratio of 50%, oscillation having an oscillation period that is, for example, ½ times the desired oscillation period is executed, and the frequency of the clock signal TIME output from the variable frequency divider 2 is divided into two. In this way, the waveform having a constant duty ratio of 50% can be obtained.

Figure 6:
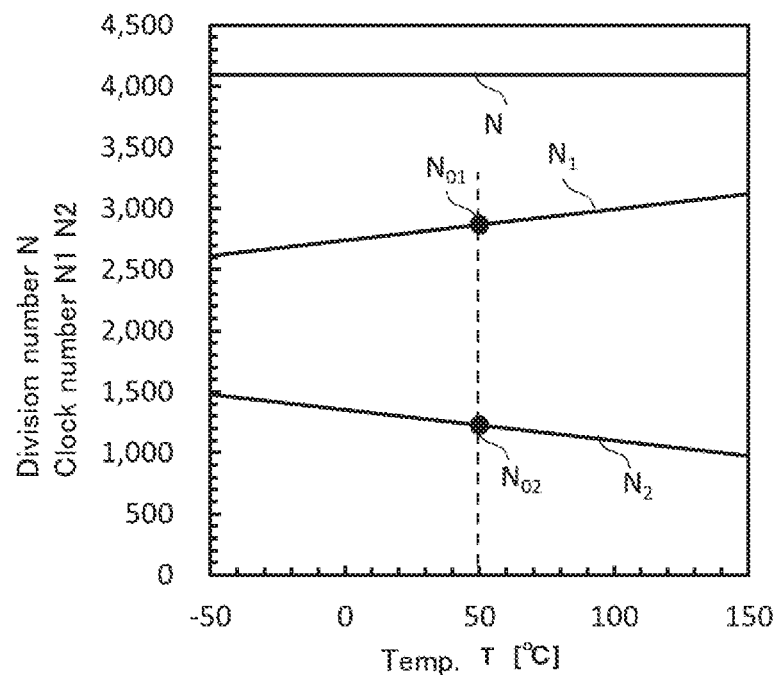
FIG. 6 is a graph for illustrating a clock number in an oscillation period and a division number of a variable frequency divider in the first embodiment.
Figure 7:
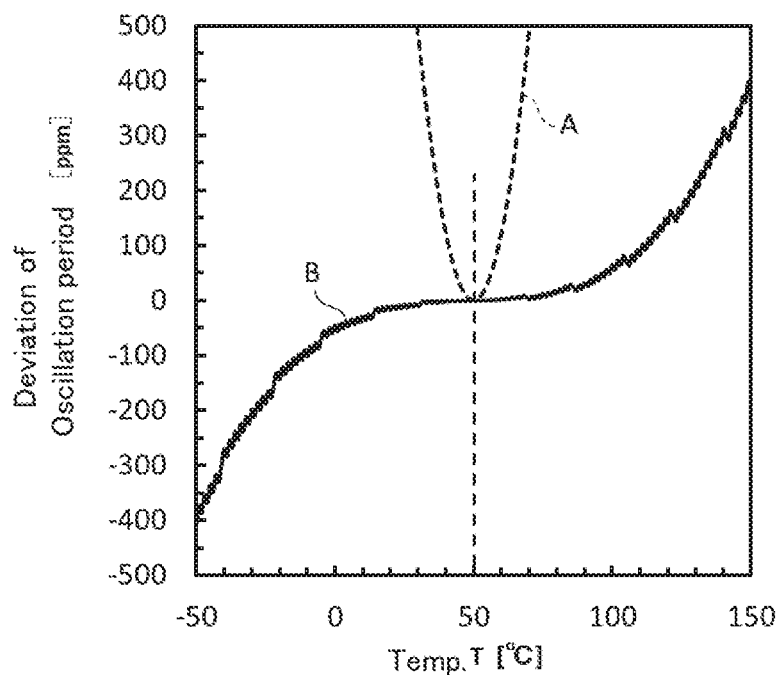
FIG. 7 is a graph for illustrating temperature characteristics of the oscillation period of the relaxation oscillator according to the first embodiment.

FIG. 6 and FIG. 7 are graphs for illustrating characteristics that are observed when the relaxation oscillator according to the first embodiment is controlled based on the above-described compensation principle to compensate for a deviation of the oscillation period P that is induced by a temperature change. The axis of abscissa in FIG. 6 indicates temperature. On the axis of ordinate in FIG. 6, the clock number is indicated by $N_1$ and $N_2$, and the division number is indicated by N. The axis of abscissa in FIG. 7 indicates temperature. The axis of ordinate in FIG. 7 indicates the amount of variation from a reference temperature in the oscillation period P in units of PPM.

Conditions of FIG. 6 and FIG. 7 include setting the oscillation periods $P_1$ and $P_2$ of the relaxation oscillation circuit 1 at the reference temperature $T_0$ which is 50° C., equal to each other at 30.518 US ($P_{01}=P_{02}=1/32.768$ kHz), setting the division number N to $2^{12}=4096$ so that the oscillation period P of Output from the variable frequency divider 2 is 0.125 mS, and setting the values of the temperature coefficients of the oscillation periods $P_1$ and $P_2$ (namely, the temperature coefficients of the variable resistor 16 and the variable resistor 20) so that $\alpha_1$, $\alpha_2$, $\beta_1$, and $\beta_2$ are $-5.928\text{E}-4[-/^\circ \text{C.}]$, $1.0464\text{E}-6[-/^\circ \text{C.}^2]$, $1.385\text{E}-3[-/^\circ \text{C.}]$, and $7.876\text{E}-7[-/^\circ \text{C.}^2]$, respectively.

FIG. 6 is a graph for illustrating a set value that is set as the clock number $N_1$ to the counter 3, the value of the clock number $N_2$ in the oscillation period $P_2$, and the division number N of the variable frequency divider 2 in relation to temperature. The set value illustrated in the graph as the clock number $N_1$ set to the counter 3 is varied in proportion to a temperature change, based on the above-described compensation principle to compensate for a deviation of the oscillation period P that is induced by a temperature change. The division number N of the variable frequency divider 2 is constant (N=4096) regardless of temperature, and the amount of change of the clock number $N_2$ in the oscillation period $P_2$ in relation to temperature is accordingly opposite in sign from the amount of change of the clock number $N_1$ in the oscillation period $P_1$, and the same in magnitude as the change amount of the clock number $N_1$. The set value set as the clock number $N_1$ to the counter 3 in FIG. 6 and the clock number $N_2$ in the oscillation period $P_2$ in FIG. 6 fulfill the condition expressed by Expression (18).

FIG. 7 is a graph for illustrating a temperature-induced deviation of the oscillation period P (variation amount of the oscillation period) in the clock signal TIME output from the relaxation oscillator according to the first embodiment. A curve A in FIG. 7 indicates characteristics of a deviation of the oscillation period P due to a temperature change that is observed when the set value set as the clock number $N_1$ to the counter 3 is fixed to the clock number $N_{01}$ which is the clock number $N_1$ in the oscillation period $P_1$ at the reference temperature $T_0$, regardless of the temperature. In this case, the first-order temperature deviation of the oscillation period P is reduced to zero, whereas the second-order temperature deviation of the oscillation period P is uncompensated and remains.

A curve B in FIG. 7 indicates characteristics of a deviation of the oscillation period P due to a temperature change that is observed when the set value set as the clock number $N_1$ to the counter 3 is controlled so as to take the value illustrated in FIG. 6 in accordance with temperature, based on the above-described compensation principle to compensate for a temperature-induced deviation of the oscillation period P. An error of the oscillation period P occurs and a deviation from the oscillation period P at the reference temperature (50° C.) increases when the temperature change from the reference temperature is greater, because the conditional expressions for canceling the first-order temperature deviation of the oscillation period P are approximate solutions. However, a deviation of the oscillation period P that is induced by a temperature change in a temperature range of 0° C. to 100° C. takes a value between −55.7 PPM and +64.7 PPM. The deviation is very small compared to deviations in relaxation oscillators of the related art, and is close to a deviation of the oscillation period in a crystal oscillator that has no deviation compensation function.

The curve B in FIG. 7 indicates that the deviation of the oscillation period P that is induced by a temperature change has the characteristic of increasing in a low-temperature area and a high-temperature area that are distant from the reference temperature (50° C.). A deviation of the oscillation period P that is induced by a temperature change can be reduced to zero throughout the entire temperature range when it is possible to use the same value as the second-order temperature coefficients of the oscillation periods $P_1$ and $P_2$ (i.e., the second-order temperature coefficients of the variable resistor 16 and the variable resistor 20).

In order to improve the precision of the compensation for a temperature-induced deviation of the oscillation period in the relaxation oscillation circuit in the first embodiment, the relaxation oscillation circuit is formed on a single semiconductor chip, and the variable resistor 16 and the variable resistor 20 are arranged next to each other. This uniformizes the temperature of the variable resistor 16 and the temperature of the variable resistor 20, and the precision of oscillation period deviation compensation is consequently improved.

(Second Embodiment)

Figure 8:
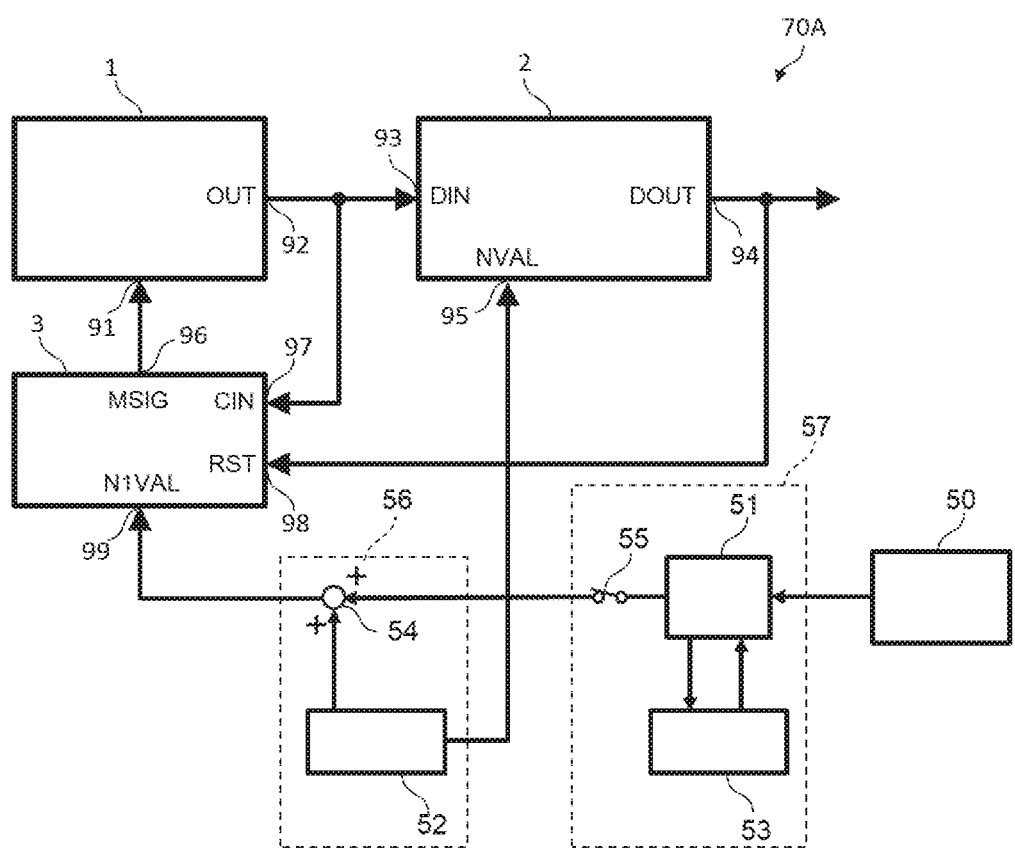
FIG. 8 is a diagram for illustrating a configuration of a relaxation oscillator according to a second embodiment of the present invention.

FIG. 8 is a diagram for illustrating a configuration of a relaxation oscillator 70A which is an example of a relaxation oscillator according to a second embodiment of the present invention. In the following description, components that are the same as those of component above-described such as the relaxation oscillator 70 and each component included therein are denoted by the same reference symbols in order to omit duplicate descriptions. The relaxation oscillator 70A includes the relaxation oscillation circuit 1, the variable frequency divider 2, the counter 3, a temperature sensor 50, a calculation circuit 51, a first memory 52, a second memory 53, an adder 54, and a switch 55. The first memory 52 and the adder 54 form a circuit 56 serving as a first circuit. The circuit 56 is configured to generate a signal used to adjust the clock number $N_1$ and the clock number $N_2$ in one period of the clock signal TIME output from the variable frequency divider 2. The second memory 53 and the calculation circuit 51 form a circuit 57 serving as a second circuit. The circuit 57 is configured to generate a signal used to increase one of the clock number $N_1$ and the clock number $N_2$ and decrease the other of the two.

The temperature sensor 50 measures the temperature and outputs the result of the measurement as temperature data to the calculation circuit 51. The calculation circuit 51 calculates the variable amount ΔN (ΔN may take a positive value and a negative value) of a set value that is set as the clock number N1 to the counter 3 for reducing the second-order temperature deviation of the oscillation period $P_1$ of the relaxation oscillation circuit 1 to zero by compensation. The calculation circuit 51 calculates the variable amount ΔN based on a signal from the temperature sensor 50 and the value of the second memory, and outputs the calculated variable amount as a correction value for correcting the set value of the clock number $N_1$.

The first memory 52 holds the value of the division number N of the variable frequency divider 2, and a set value set as the clock number $N_{01}$ to the counter 3 at which the first-order temperature deviation of the relaxation oscillation circuit 1 is zero at the reference temperature $T_0$. The value of the division number N of the variable frequency divider 2 is read out of the first memory 52 and input to the NVAL terminal 95 of the variable frequency divider 2.

The second memory 53 holds data required by the calculation circuit 51 to calculate the variable amount ΔN of a set value that is set as the clock number $N_1$ to the counter 3, or holds the variable amount ΔN that is associated with the temperature T. The calculation circuit 51 specifies an address in the second memory 53 to read data held in the second memory 53.

The adder 54 adds a value that is set as the clock number $N_{01}$ to the counter 3 and held in the first memory 52, and the variable amount ΔN calculated by the calculation circuit 51 for a set value that is set as the clock number $N_1$ to the counter 3, and hands a set value to be set as the clock number $N_1$ over to the counter 3.

The switch 55 controls whether the variable amount $\Delta N$ of a set value that is set as the clock number $N_1$ to the counter 3 is to be transmitted to the adder 54. Whether to compensate for the second-order temperature deviation of the oscillation period $P_1$ is selectable by opening or closing the switch 55.

According to the relaxation oscillator 70A of the second embodiment of the present invention, the second-order deviation of the oscillation period P of the clock signal TIME can be compensated automatically by the series of mechanisms described above. The relaxation oscillation circuit in the second embodiment keeps the oscillation period P very stable.

(Third Embodiment)

Figure 9:
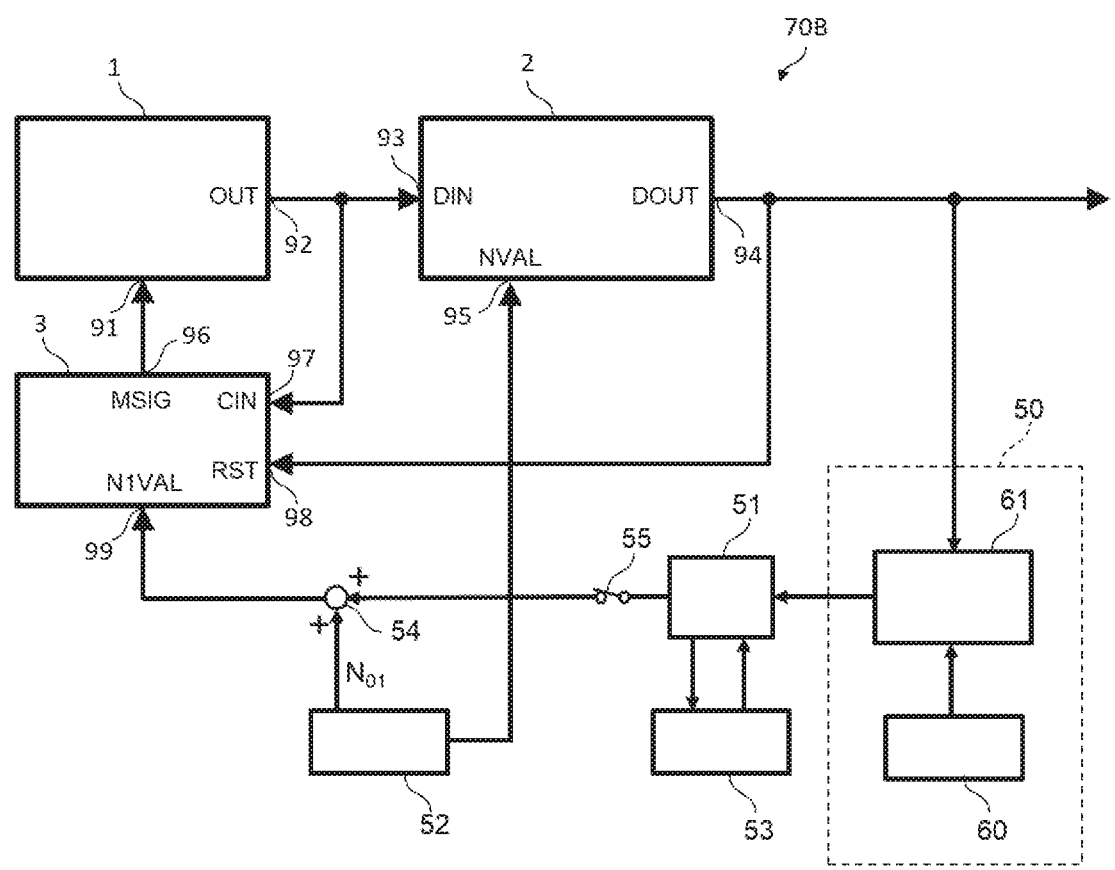
FIG. 9 is a diagram for illustrating a configuration of a relaxation oscillator according to a third embodiment of the present invention.

FIG. 9 is a diagram for illustrating a configuration of a relaxation oscillator 70B which is an example of a relaxation oscillator according to a third embodiment of the present invention. The third embodiment provides an example of a more specific configuration of the temperature sensor 50 in the second embodiment of the present invention. In the third embodiment, other than the relaxation oscillation circuit 1 oscillating in the output period P described in the second embodiment, a second oscillation circuit 60 is further included in the temperature sensor 50. The second oscillation circuit 60 is configured to output as a fourth clock.

Figure 13:
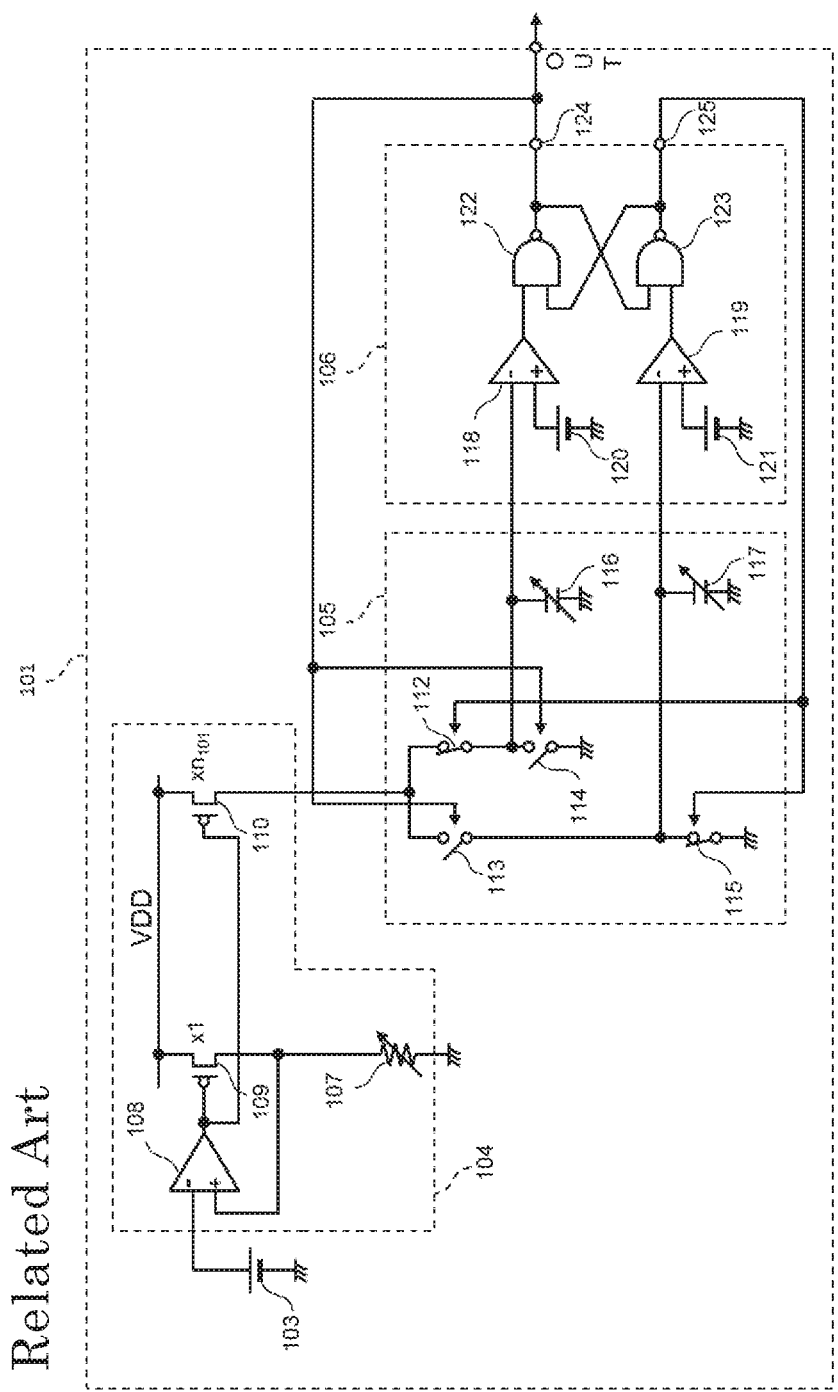
FIG. 13 is a diagram for illustrating the configuration of the relaxation oscillator of the related art.

The temperature sensor 50 includes the second oscillation circuit 60 and a second counter 61. The relaxation oscillation circuit 101 (FIG. 13) of the related art or the relaxation oscillation circuit 1 (FIG. 2) in the embodiments of the present invention may be used as the second oscillation circuit 60. When the relaxation oscillation circuit 1 in the embodiments of the present invention is employed, the $I_1$ oscillation mode alone (or the $I_2$ oscillation mode alone) is selected for the relaxation oscillation circuit 1.

A description is made below on the detection of a temperature change in the relaxation oscillator 70B, and on the principle and procedure of compensation for a deviation of the oscillation period P that is induced by a temperature change.

The premise here is that the second oscillation circuit 60 uses a resistor of the same material as that of the variable resistor 16 (meaning that the first-order temperature coefficient of the resistor is $\alpha_1$) in the relaxation oscillation circuit 1 to generate an oscillation period $P_3$ (alternatively, the second oscillation circuit 60 may use a resistor of the same material as that of the variable resistor 20 to generate the oscillation period $P_3$). The oscillation period $P_3$ of the second oscillation circuit 60 is expressed by Expression (21) when a first-order temperature coefficient of the resistor is taken into consideration. The oscillation period $P_3$ varies greatly depending on temperature because no compensation is made for a deviation of the oscillation period $P_3$ that is induced by a temperature change.

$$P_3 = P_{03}(1 + \alpha_1 \Delta T) \tag{21}$$

In Expression (21):

$P_{03}$ represents an oscillation period of the second oscillation circuit 60 at the reference temperature $T_0$, $\alpha_1$ represents the first-order temperature coefficient of the resistor used in the second oscillation circuit 60 to generate a current, and $\Delta T$ represents a temperature change amount of a change from the reference temperature $T_0$.

When measured against the oscillation period $P_3$ of the second oscillation circuit 60, the oscillation period P of the clock signal TIME output from the relaxation oscillation circuit 1 can be deemed as a substantially constant value because the ratio between the clock number $N_{01}$ at the oscillation period value $P_{01}$ and the clock number $N_{02}$ at the oscillation period value $P_{02}$ is adjusted, and the first-order deviation is zero (in a state in which the switch 55 is open).

Output from the variable frequency divider 2 is input to the second counter 61, and the second counter 61 counts oscillation clock of the second oscillation circuit 60 for the duration of one period (oscillation period P) of the output. A count value m of the second counter 61 in this case is expressed by Expression (22) when the first-order temperature coefficient of the resistor is taken into consideration.

$$m = \frac{P}{P_3} = \frac{N_{01} P_{01}(1 + \alpha_1 \Delta T) + N_{02} P_{02}(1 + \beta_1 \Delta T)}{P_{03}(1 + \alpha_1 \Delta T)} \tag{22}$$

Expression (23) is obtained by obtaining an approximate solution about the temperature change amount $\Delta T$ from Expression (22), and the temperature change amount $\Delta T$ may be figured out by using the count value m of the second counter 61 as temperature data.

$$\Delta T \approx \frac{m - \frac{P}{P_{03}}}{N_{02}(\beta_1 - \alpha_1)\frac{P_{02}}{P_{03}}} \tag{23}$$

The calculation circuit 51 calculates the variable amount $\Delta N$ for compensating for the first-order temperature deviation of the oscillation period P of the relaxation oscillation circuit 1, from the count value m of the second counter 61, and outputs the calculated variable amount as a correction value. When the switch 55 is closed, count data obtained by adding the variable amount $\Delta N$ to the clock number $N_{01}$ is input to the N1VAL terminal 99 of the counter 3, and the second-order temperature deviation of the oscillation period P of the relaxation oscillation circuit 1 is corrected.

The relaxation oscillator 70B described above is operated with the switch 55 opened during the detection of a temperature change by the temperature sensor 50 (namely, a case in which compensation is made only for the first-order deviation of the oscillation period P that is induced by a temperature change in the relaxation oscillation circuit 1). However, the relaxation oscillator 70B presents the same effect also when the switch 55 is closed during the detection of a temperature change (namely, a case in which compensation is extended to the second-order deviation of the oscillation period P that is induced by a temperature change in the relaxation oscillation circuit 1).

This is because, compared to the oscillation period of the second oscillation circuit 60 (oscillation period $P_3$), the oscillation period of the relaxation oscillation circuit 1 (oscillation period P) can be deemed as approximately constant regardless of temperature, in any of the case in which compensation is made only for the first-order deviation of the oscillation period P that is induced by a temperature change in the relaxation oscillation circuit 1 (case in which the switch 55 is open) and the case in which compensation is extended to the second-order deviation of the oscillation period P that is induced by a temperature change in the relaxation oscillation circuit 1 (case in which the switch 55 is closed).

In order to enhance the precision of compensation for the second-order temperature deviation of the oscillation period P by enhancing the precision of temperature change detection with the configuration of the third embodiment, the relaxation oscillation circuit 1 in the relaxation oscillator 70B is formed on a single semiconductor chip, and the relaxation oscillation circuit 1 and the second oscillation circuit 60 are arranged as close to each other as possible. Alternatively, resistors having resistance values serving as references for the oscillation periods of the two oscillation circuits may be arranged next to each other as one of ways to uniformize the temperatures of the resistors. The uniformization of the temperatures of the resistors is effective in enhancing the precision.

The relaxation oscillator 70B may also have a configuration in which the current source circuit 11 (or the current source circuit 12) of the relaxation oscillation circuit 1 is shared with the second oscillation circuit 60. This eliminates a relative error caused by a temperature change in the oscillation period P of the relaxation oscillation circuit 1 and the oscillation period $P_3$ of the second oscillation circuit 60, and accordingly enhances the precision of temperature detection, thus improving the precision of compensation for a deviation of the oscillation period P that is induced by a temperature change.

(Fourth Embodiment)

Figure 10:
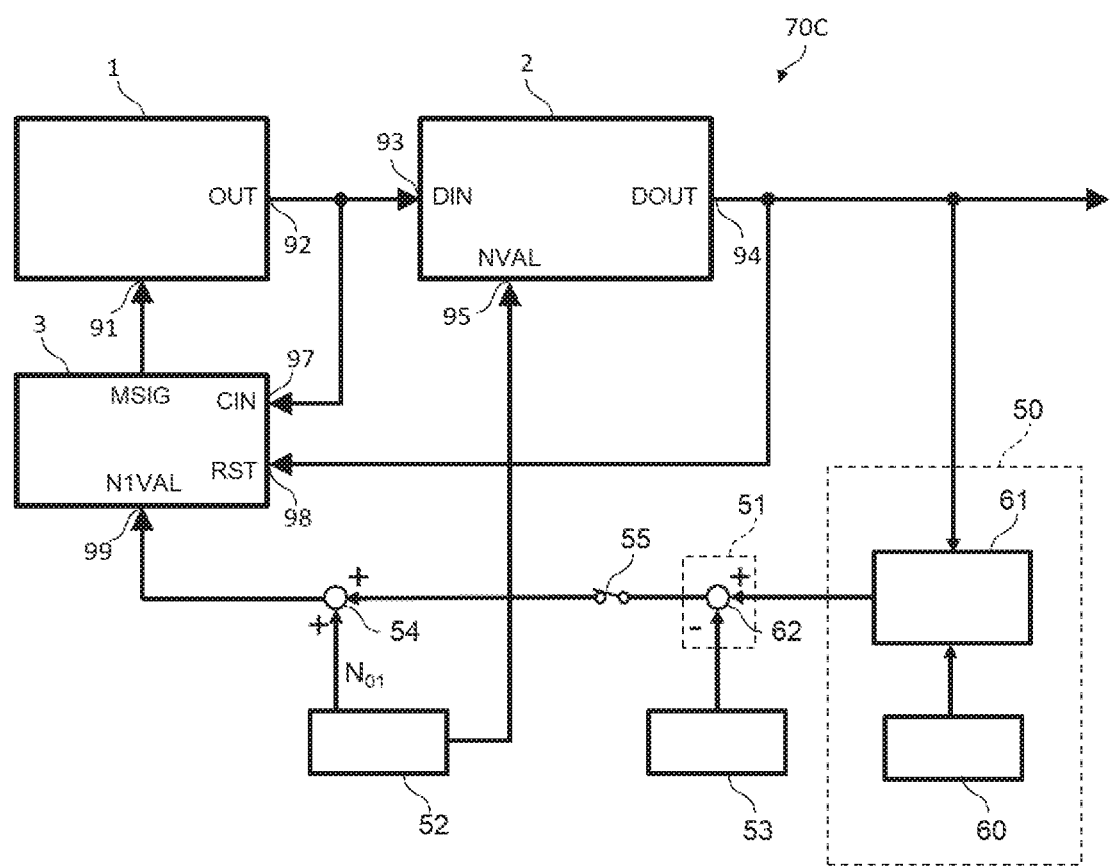
FIG. 10 is a diagram for illustrating a configuration of a relaxation oscillator according to a fourth embodiment of the present invention.

FIG. 10 is a diagram for illustrating a configuration of a relaxation oscillator 70C which is an example of a relaxation oscillator according to a fourth embodiment of the present invention. The fourth embodiment provides a specific example in which only a simple configuration is required for the calculation circuit 51 in the third embodiment of the present invention.

In the configuration of FIG. 10, the calculation circuit 51 includes a subtracter 62. A set value that is set as the clock number $N_1$ by the relaxation oscillation circuit 1 to the counter 3 is expressed by Expression (24) from Expression (14) and. Expression (23).

$$N_1 = N_{01} + N_{01}\gamma_1 \Delta T \qquad (24)$$
$$= N_{01} + \frac{N_{01}\gamma_1}{N_{02}(\beta_1 - \alpha_1)\frac{P_{02}}{P_{03}}}\left(m - \frac{P}{P_{03}}\right)$$

The second term in Expression (24) is the variable amount $\Delta N$ for compensating for a first-order temperature deviation of the oscillation period P in the clock signal TIME output from the relaxation oscillator 70C. The calculation of the variable amount $\Delta N$ is simplified to $(M - P/P_{03})$ when the oscillation period value $P_{03}$ of the second oscillation circuit 60 at the reference temperature $T_0$ is set to a special value expressed by Expression (25) in Expression (24). In short, the relaxation oscillator 70C does not require multiplication, and can accordingly be reduced significantly in the circuit scale of the calculation circuit 51.

$$P_{03} = \frac{N_{02}P_{02}(\beta_1 - \alpha_1)}{N_{01}\gamma_1} \qquad (25)$$

The value "$P/P_{03}$" can approximately be deemed as substantially constant. When this is defined as a constant M as expressed in Expression (26), the calculation of the variable amount $\Delta N$ takes the form of Expression (27). In other words, the calculation circuit 51 requires no other components than the subtracter 62 as illustrated in FIG. 10, and the second memory 53 is only required to hold the constant M. The relaxation oscillator 70C can therefore be significantly reduced in circuit scale.

$$M \equiv \frac{P}{P_{03}} \approx \frac{N_{01}P_{01} + N_{02}P_{02}}{P_{03}} \qquad (26)$$

$$N_1 = N_{01} + (m - M) \qquad (27)$$

Figure 11:
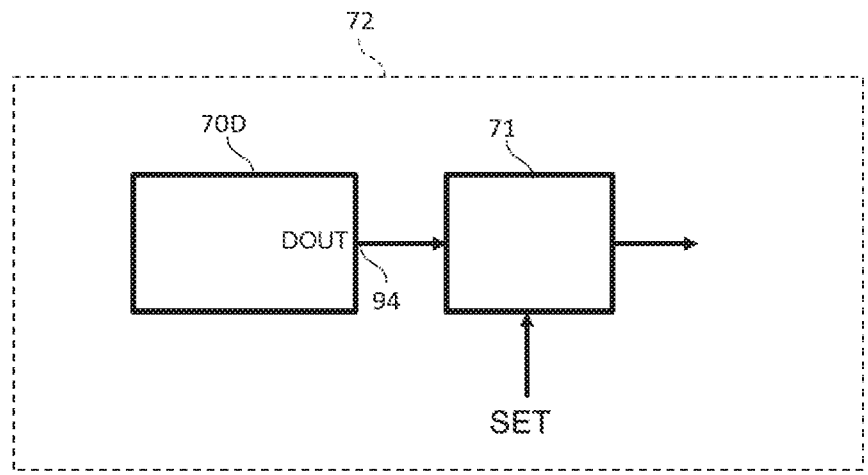
FIG. 11 is a diagram for illustrating an electronic device including the relaxation oscillator according to any one of the first to fourth embodiments of the present invention.
Figure 12:
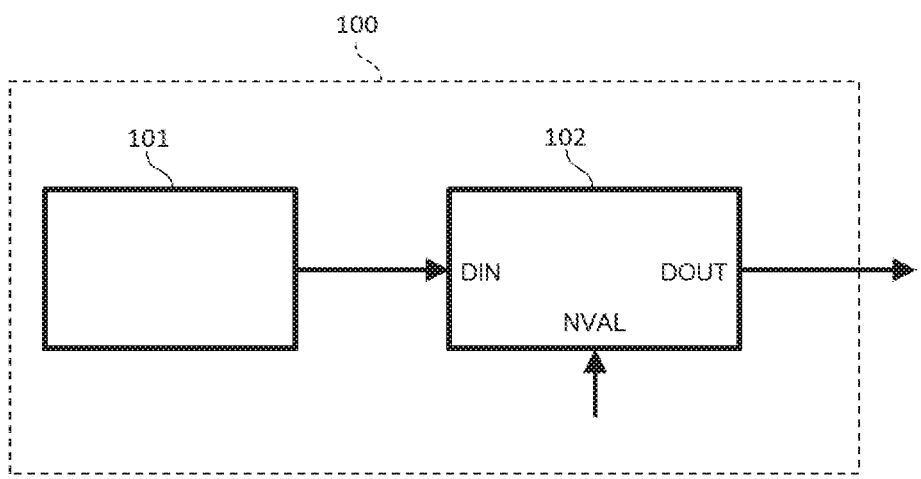
FIG. 12 is a diagram for illustrating a configuration of a relaxation oscillator of the related art.

FIG. 11 is a diagram for illustrating an example in which one of the relaxation oscillators according to the first to fourth embodiments of the present invention is applied to an electronic device 72. In the example, one of the relaxation oscillators according to the first to fourth embodiments of the present invention is used as a relaxation oscillator 70D, and a logic circuit 71 is included, The logic circuit 71 outputs a clock signal that serves as a reference to the electronic device 72 which is a timer, a clock, or the like, based on a set value (SET) to be set from the outside, by using the clock signal TIME that is generated by the relaxation oscillator 70D as a reference.

In each of the relaxation oscillators according to the first to fourth embodiments of the present invention, a temperature-induced deviation of an oscillation period of the relaxation oscillator is very small, and the relaxation oscillator can therefore be used as a reference clock signal source of the electronic device 72, such as a highly precise timer or clock, or a similar type device, while it is difficult for relaxation oscillators of the related art to be used.

The description made above on the principle of compensation for a deviation that is induced by a temperature change in the oscillation period P of the clock signal TIME output from each of the relaxation oscillators according to the first to fourth embodiments of the present invention is focused on the temperature coefficients of only the variable resistor 16 and the variable resistor 20. The most significant feature of the present invention is that a temperature deviation of the oscillation period P that is generated for the clock signal TIME by taking into consideration the overall influence of the oscillator, including the influence from temperature coefficients of oscillator components other than the resistors (variable capacitors, a logical element, a power source, and the like), can be reduced to substantially zero by compensation.

This compensation becomes possible under a condition in which the absolute values of the temperature coefficients of the oscillator components other than the variable resistors are sufficiently smaller than the absolute values of the first-order temperature coefficients $\alpha_1$ and $\beta_1$ of the variable resistor 16 and the variable resistor 20 (as a guide, 1/10 or smaller of the first-order temperature coefficients of the variable resistors). Under this condition, the first-order temperature deviation of the oscillation period P that takes the overall influence of the oscillator into consideration can be adjusted to zero by independently adjusting the first-order temperature deviation through an adjustment of the ratio of the oscillation period values $P_{01}$ and $P_{02}$, because the temperature coefficients of the variable resistor 16 and the variable resistor 20 are dominant in variations of the oscillation period P that depend on temperature. The second-order temperature deviation of the oscillation period P that takes the overall influence of the oscillator into consideration can be adjusted to substantially zero by independently adjusting the second-order temperature deviation through an adjustment in which the oscillation period value $P_{03}$ of the second oscillation circuit 60 in the third embodiment or the fourth embodiment at the reference temperature $T_0$ is increased or decreased.

It is noted that the present invention is not limited to the above-described embodiments as they are and, in an implementation phase, can be embodied in various forms other than the specific embodiments described above. Various omissions, additions, substitutions, and changes may be made without departing from the spirit and scope of the invention. These embodiments and modifications thereof are included within the sprit and scope of the invention and are included within the scope of the invention as disclosed in the claims and equivalents thereof.

What is claimed is:

1. A relaxation oscillator, comprising:
an oscillation circuit;
a variable frequency divider; and
a counter,
the oscillation circuit including:
a clock generation circuit configured to generate a first clock signal having a first oscillation period having a positive value as a first-order temperature coefficient and having a second oscillation period having a negative value as a second-order temperature coefficient;
and
an output terminal configured to output the first clock signal,
the variable frequency divider including a divider setting terminal from which a division number is provided, the variable frequency divider being configured to divide a frequency of the first clock signal into a number determined by the division number provided from the divider setting terminal, and to output a second clock signal obtained by dividing the frequency of the first clock signal as an output of the relaxation oscillator,
the counter including a counter setting terminal from which count data is provided and a reset terminal from which the second clock signal is provided, the counter being configured to output one of a first and second switching signals, the first switching signal being switched in accordance with a result of counting the first clock signal with reference to the count data provided from the counter setting terminal, the second switching signal being switched in accordance with the second clock signal provided from the reset terminal.

2. The relaxation oscillator according to claim 1, further comprising a temperature sensor, a first circuit, and a second circuit,
wherein the temperature sensor is configured to supply temperature data to the first circuit,
wherein the first circuit is configured to supply a correction value for correcting the count data to the second circuit, and
wherein the second circuit is configured to supply the division number to the variable frequency divider, and to supply the count data corrected with the correction value to the counter.

3. The relaxation oscillator according to claim 2,
wherein the first circuit includes a second memory and a calculation circuit,
wherein the second circuit includes a first memory and an adder,
wherein the first memory is configured to hold the division number to be set to the variable frequency divider and the count data to be set to the counter,
wherein the second memory is configured to hold a value to be used to calculate the correction value in the calculation circuit,
wherein the first circuit is configured to calculate the correction value in the calculation circuit, based on the temperature data from the temperature sensor and on the value held in the second memory, and to output the correction value to the second circuit, and
wherein the second circuit is configured to supply, to the counter, a calculation value obtained by the adder by adding the correction value and a value of the first memory.

4. The relaxation oscillator according to claim 2, wherein the temperature sensor includes a second oscillation circuit configured to output a third clock signal and a second counter to which the third clock signal is supplied.

5. The relaxation oscillator according to claim 3, wherein the temperature sensor includes a second oscillation circuit configured to output a third clock signal and a second counter to which the third clock is supplied.

6. The relaxation oscillator according to claim 3, wherein the calculation circuit includes a subtracter.

7. The relaxation oscillator according to claim 1,
wherein the clock generation circuit includes a first resistor to generate the first clock signal.

8. The relaxation oscillator according to claim 1,
wherein the clock generation circuit includes a second resistor to generate the second clock signal.

9. The relaxation oscillator according to claim 1, wherein a ratio between a product that obtained by multiplying the second oscillation period by the second-order temperature coefficient for a temperature change in the second oscillation period and a product that obtained by multiplying the first oscillation period by the first-order temperature coefficient for a temperature change in the first oscillation period, is equal in absolute value to, and is opposite in terms of plus and minus signs from, a ratio between the first oscillation period and the second oscillation period.

10. An electronic device, comprising:
the relaxation oscillator of claim 1; and
a clock signal generation circuit configured to generate a clock signal based upon the clock of the relaxation oscillator and a value to be set.

* * * * *